(12) United States Patent
Konno et al.

(10) Patent No.: US 12,523,930 B2
(45) Date of Patent: Jan. 13, 2026

(54) NANOIMPRINT COMPOSITION AND PATTERN FORMING METHOD

(71) Applicant: TOKYO OHKA KOGYO CO., LTD., Kawasaki (JP)

(72) Inventors: Kenri Konno, Kawasaki (JP); Risako Mori, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 629 days.

(21) Appl. No.: 17/658,940

(22) Filed: Apr. 12, 2022

(65) Prior Publication Data

US 2022/0334470 A1 Oct. 20, 2022

(30) Foreign Application Priority Data

Apr. 20, 2021 (JP) .................................. 2021-071290

(51) Int. Cl.
| | |
|---|---|
| *G03F 7/34* | (2006.01) |
| *B29C 35/08* | (2006.01) |
| *G03F 7/00* | (2006.01) |
| *G03F 7/028* | (2006.01) |

(52) U.S. Cl.
CPC ............ *G03F 7/0002* (2013.01); *B29C 35/08* (2013.01); *G03F 7/028* (2013.01); *G03F 7/34* (2013.01)

(58) Field of Classification Search
None
See application file for complete search history.

(56) References Cited

U.S. PATENT DOCUMENTS

| | | | | |
|---|---|---|---|---|
| 2008/0015278 | A1* | 1/2008 | Malik | C08J 3/28 526/240 |
| 2008/0305359 | A1* | 12/2008 | Aiba | H05B 33/04 428/689 |
| 2011/0031658 | A1* | 2/2011 | Saifullah | B82Y 40/00 264/496 |
| 2012/0094888 | A1* | 4/2012 | Kaneda | G03F 7/325 510/176 |
| 2012/0315451 | A1* | 12/2012 | Malik | C08F 4/12 428/209 |
| 2013/0241092 | A1 | 9/2013 | Takeuchi et al. | |
| 2015/0044688 | A1* | 2/2015 | Richter | B01L 3/502738 435/6.12 |
| 2022/0334475 | A1* | 10/2022 | Konno | G03F 7/0047 |

FOREIGN PATENT DOCUMENTS

| | | | | |
|---|---|---|---|---|
| CN | 104277173 A | * | 1/2015 | |
| EP | 2156850 A1 | * | 2/2010 | ............ C08F 291/18 |
| JP | 62252405 A | * | 11/1987 | |
| JP | 2006521431 A | * | 9/2006 | |

(Continued)

*Primary Examiner* — Martin J Angebranndt
(74) *Attorney, Agent, or Firm* — KNOBBE, MARTENS, OLSON & BEAR, LLP

(57) ABSTRACT

A nanoimprint composition including an unsaturated acid metal salt (R), a photopolymerizable compound (B), a photoradical polymerization initiator, and a solvent component having compatibility with the unsaturated acid metal salt (R) and the photopolymerizable compound (B), in which a content of the unsaturated acid metal salt (R) is 50 parts by mass or greater with respect to 100 parts by mass of a total content of the unsaturated acid metal salt (R) and the photopolymerizable compound (B).

12 Claims, 1 Drawing Sheet

(56) References Cited

FOREIGN PATENT DOCUMENTS

| | | | | | |
|---|---|---|---|---|---|
| JP | 2012171103 | A | * | 9/2012 | |
| JP | 2013-191800 | A | | 9/2013 | |
| JP | 2014035392 | A | * | 2/2014 | |
| JP | 2016074156 | A | * | 5/2016 | |
| JP | 2018124412 | A | * | 8/2018 | |
| KR | 20070007876 | A | * | 1/2007 | ............ B32B 27/30 |
| KR | 2014136320 | A | * | 11/2014 | ............ B29C 59/02 |
| WO | WO-2009006010 | A2 | * | 1/2009 | ............ C23C 18/04 |
| WO | WO-2018156766 | A2 | * | 8/2018 | ............ B33Y 10/00 |

\* cited by examiner

NANOIMPRINT COMPOSITION AND PATTERN FORMING METHOD

BACKGROUND OF THE INVENTION

Field of the Invention

The present invention relates to a nanoimprint composition and a pattern forming method.

Priority is claimed on Japanese Patent Application No. 2021-071290, filed on Apr. 20, 2021, the content of which is incorporated herein by reference.

Description of Related Art

A lithography technology is a core technology in the process of manufacturing semiconductor devices, and with the recent increase in the integration of semiconductor integrated circuits (IC), further miniaturization of wiring is progressing. Typical examples of the miniaturization method include shortening the wavelength of a light source using a light source having a shorter wavelength such as a KrF excimer laser, an ArF excimer laser, an $F_2$ laser, extreme ultraviolet light (EUV), an electron beam (EB), or an X-ray, and increasing the diameter (increase in NA) of the numerical aperture (NA) of a lens of an exposure device.

Under the above-described circumstances, nanoimprint lithography, which is a method of pressing a mold having a predetermined pattern against a curable film formed on a substrate so that the pattern of the mold is transferred to the curable film, is expected as a fine pattern forming method for a semiconductor from the viewpoint of the productivity.

In the nanoimprint lithography, a photocurable composition containing a photocurable compound that is cured by light (ultraviolet rays or electron beams) is used. In such a case, a transfer pattern (structure) is obtained by pressing a mold having a predetermined pattern against a curable film containing a photocurable compound, irradiating the curable film with light to cure the photocurable compound, and peeling the mold off from the cured film.

The photocurable composition used for nanoimprint lithography is required to have properties such as coatability in a case where a substrate is coated with the composition through spin coating or the like; and curability in a case where the composition is heated or exposed. In a case where the coatability thereof on the substrate is poor, the film thickness of the photocurable composition applied onto the substrate is uneven, and the pattern transferability is likely to be degraded in a case where the mold is pressed against the curable film. Further, the curability is an important property for maintaining the pattern formed by pressing the mold to have desired dimensions. Further, the photocurable composition is also required to have satisfactory mold releasability in a case where the mold is peeled off from the cured film.

In recent years, it has been examined to apply nanoimprint lithography for enhancing the functionality of 3D sensors for autonomous driving and AR waveguides for AR (augmented reality) glasses. In the 3D sensors and AR glasses, a permanent film material constituting a part of the device is required to have high properties.

For example, Japanese Unexamined Patent Application, First Publication No. 2013-191800 suggests a film-forming composition for photoimprint in which a high refractive index and satisfactory pattern transferability are achieved by blending metal oxide nanoparticles such as titanium oxide or zirconium oxide, a photopolymerizable monomer containing a hydrophilic group, and a photopolymerization initiator.

SUMMARY OF THE INVENTION

In the imprint process, as the pattern becomes finer and more complicated, the contact area between the mold material and the nanoimprint material increases, and the stress generated on the nanoimprint material during mold release also increases. Therefore, nanoimprint materials of the related art, resistance to the stress during the release is required now more than ever. In particular, in a case where nanoimprint materials are used for AR glasses and the like, the nanoimprint materials are required to have satisfactory fine pattern transferability in addition to the resistance to the stress during the release and to reduce haze in a visible light region.

The present invention has been made in consideration of the above-described circumstances, and an object thereof is to provide a nanoimprint composition and a pattern forming method, in which fine pattern transferability during pattern formation is satisfactory and improvement of stress resistance and reduction of haze of a cured material in a visible light region can be further achieved.

Solution to Problem

In order to solve the above-described problems, the present invention has adopted the following configurations.

That is, according to a first aspect of the present invention, there is provided a nanoimprint composition including a component (R) which is an unsaturated acid metal salt, a component (B) which is a photopolymerizable compound (where a compound corresponding to the component (R) is excluded), a component (C) which is a photoradical polymerization initiator, and a component (S1) which is a solvent component having compatibility with the component (R) and the component (B), in which a content of the component (R) is 50 parts by mass or greater with respect to 100 parts by mass of a total content of the component (R) and the component (B).

According to a second aspect of the present invention, there is provided a pattern forming method including a step of forming a photocurable film on a substrate using the nanoimprint composition according to the first aspect, a step of pressing a mold having an uneven pattern against the photocurable film to transfer the uneven pattern to the photocurable film, a step of exposing the photocurable film to which the uneven pattern has been transferred while pressing the mold against the photocurable film to form a cured film, and a step of peeling the mold off from the cured film.

According to the present invention, it is possible to provide a nanoimprint composition and a pattern forming method, in which fine pattern transferability during pattern formation is satisfactory and improvement of stress resistance and reduction of haze of a cured material in a visible light region can be further achieved.

DETAILED DESCRIPTION OF THE INVENTION

Figure 1A:
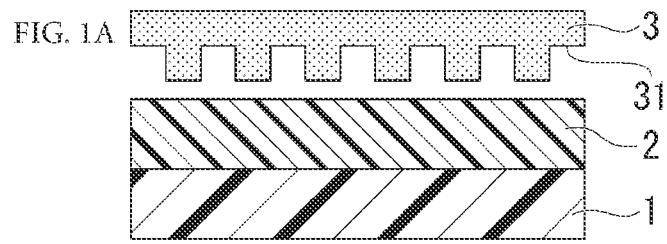
FIG. 1A is a schematic step view for describing an embodiment of a nanoimprint pattern forming method.

In the present description and the scope of the present patent claims, the term "aliphatic" is a relative concept used in relation to the term "aromatic", and defines a group or compound that has no aromaticity.

The term "alkyl group" includes a linear, branched, or cyclic monovalent saturated hydrocarbon group unless otherwise specified. The same applies to the alkyl group in an alkoxy group.

The "(meth)acrylate" indicates at least one of acrylate and methacrylate. The "(meth)acrylic acid" indicates at least one of acrylic acid and methacrylic acid.

The expression "may have a substituent" includes both a case where a hydrogen atom (—H) is substituted with a monovalent group and a case where a methylene (—$CH_2$—) group is substituted with a divalent group.

The term "light exposure" is a general concept for irradiation with radiation.

The term "lower" indicates that the number of carbon atoms is in a range of 1 to 5.

(Nanoimprint Composition)

A nanoimprint composition according to a first embodiment of the present invention contains a component (R) which is an unsaturated acid metal salt, a component (B) which is a photopolymerizable compound (where a compound corresponding to the component (R) is excluded), a component (C) which is a photoradical polymerization initiator, and a component (S1) which is a solvent component having compatibility with the component (R) and the component (B).

In such a nanoimprint composition of the first embodiment, the content of the component (R) is 50 parts by mass or greater with respect to 100 parts by mass of the total content of the component (R) and the component (B).

Such a nanoimprint composition of the first embodiment is a nanoimprint composition used for a photoimprint method and is useful as a material for forming a fine pattern on a substrate by an imprint technology. In particular, the nanoimprint composition exerts an advantageous effect in applications that require a low haze and a high refractive index, such as 3D sensors for autonomous driving and AR waveguides for AR (augmented reality) glasses. Further, such a nanoimprint composition of the first embodiment is also useful as a material for, for example, an antireflection film.

The term "nanoimprint" here denotes pattern transfer having a size of several nanometers to several micrometers and is not limited to the nano-order.

Hereinafter, an embodiment of the nanoimprint composition of the first embodiment will be described.

<Component (R)>

The component (R) is an unsaturated acid metal salt.

The unsaturated acid metal salt is a compound in which an acid-derived anion in the unsaturated acid and a metal cation are ionically bonded.

The unsaturated acid is an acid having an unsaturated bond, and examples thereof include acrylic acid, methacrylic acid, crotonic acid, oleic acid, undecenoic acid, 9,12-octadienoyl acid, and 9,12,15-octatrienoic acid. Among these, acrylic acid and methacrylic acid are preferable from the viewpoint of easily forming a film having a high hardness.

Examples of the metal cation include alkali metal ions such as $Li^+$, $Na^+$, and $K^+$, alkaline earth metal ions such as $Be^{2+}$, $Mg^{2+}$, and $Ca^{2+}$, transition metal ions such as $Cu^{2+}$, $Fe^{3+}$, $Ni^{2+}$, $Mn^{2+}$, $Co^{2+}$, base metal ions such as $Al^{3+}$, $Ga^{3+}$, $Zn^{2+}$, and $Cd^{2+}$, and lanthanoid ions such as $Nd^{3+}$, $Gd^{3+}$, and $Ce^{3+}$. Among these, from the viewpoints of safety and availability, $Zn^{2+}$, $Ca^{2+}$, $Mg^{2+}$, and $Al^{3+}$ are preferable, and $Zn^{2+}$ is particularly preferable.

Preferred specific examples of the component (R) include zinc (meth)acrylate, calcium (meth)acrylate, magnesium (meth)acrylate, and aluminum (meth)acrylate.

In the present embodiment, commercially available unsaturated acid metal salts can be used as the component (R).

Examples of commercially available unsaturated acid metal salts include zinc acrylate (manufactured by Nippon Shokubai Co., Ltd.), potassium acrylate (manufactured by Nippon Shokubai Co., Ltd.), potassium methacrylate (manufactured by Nippon Shokubai Co., Ltd.), magnesium acrylate (manufactured by Asada Chemical Industry Co., Ltd.), calcium Acrylate (manufactured by Asada Chemical Industry Co., Ltd.), zinc methacrylate (manufactured by Asada Chemical Industry Co., Ltd.), magnesium methacrylate (manufactured by Asada Chemical Industry Co., Ltd.), aluminum acrylate (manufactured by Asada Chemical Industry Co., Ltd.), neodymium methacrylate (manufactured by Asada Chemical Industry Co., Ltd.), sodium methacrylate (manufactured by Asada Chemical Industry Co., Ltd.), and potassium acrylate (manufactured by Asada Chemical Industry Co., Ltd.).

In the nanoimprint composition according to the present embodiment, the component (R) may be used alone or in combination of two or more kinds thereof.

Among the components (R), from the viewpoint of easily enhancing the effects of the present invention, zinc (meth)acrylate is preferable, and zinc acrylate is particularly preferable.

The content of the component (R) in the nanoimprint composition of the present embodiment is 50 parts by mass or greater, preferably in a range of 50 to 80 parts by mass, more preferably in a range of 60 to 80 parts by mass, still more preferably in a range of 65 to 80 parts by mass, and particularly preferably in a range of 70 to 80 parts by mass with respect to 100 parts by mass of the total content of the component (R) and the component (B) described below.

In a case where the content of the component (R) is greater than or equal to the lower limit of the above-described range, the resistance of the cured film formed by using the nanoimprint composition to the stress is improved. Further, in a case where the content of the component (R) is less than or equal to the upper limit of the above-described preferable range, the hardness of the cured film formed by using the nanoimprint composition is increased, and the refractive index is easily increased.

<Component (B)>

The component (B) is a photopolymerizable compound (here, compounds corresponding to the component (R) are excluded). The photopolymerizable compound denotes a compound containing a polymerizable functional group.

The "polymerizable functional group" is a group which is capable of polymerizing compounds through radical polymerization or the like and has multiple bonds between carbon atoms such as an ethylenic double bond.

Examples of the polymerizable functional group include a vinyl group, an allyl group, an acryloyl group, a methacryloyl group, a fluorovinyl group, a difluorovinyl group, a trifluorovinyl group, a difluorotrifluoromethylvinyl group, a trifluoroallyl group, a perfluoroallyl group, a trifluoromethylacryloyl group, a nonylfluorobutylacryloyl group, a vinyl ether group, a fluorine-containing vinyl ether group, an allyl ether group, a fluorine-containing allyl ether group, a styryl group, a vinylnaphthyl group, a fluorine-containing styryl group, a fluorine-containing vinylnaphthyl group, a norbornyl group, a fluorine-containing norbornyl group, and a silyl group. Among these, a vinyl group, an allyl group, an acryloyl group, or a methacryloyl group is preferable, and an acryloyl group or a methacryloyl group is more preferable.

Examples of the photopolymerizable compound (monofunctional monomer) containing one polymerizable functional group include a (meth)acrylate having an aliphatic polycyclic structure such as isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, or tricyclodecanyl (meth)acrylate; a (meth)acrylate having an aliphatic monocyclic structure such as dicyclopentanyl (meth)acrylate, dicyclopentenyl (meth)acrylate, cyclohexyl (meth)acrylate, 4-butylcyclohexyl (meth)acrylate, or acryloylmorpholin; a (meth)acrylate having a chain structure such as 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, or isostearyl (meth)acrylate; a (meth)acrylate having an aromatic ring structure such as benzyl (meth)acrylate, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, or polyoxyethylene nonylphenyl ether (meth)acrylate; tetrahydrofurfuryl (meth)acrylate, butoxyethyl (meth)acrylate, ethoxydiethylene glycol (meth)acrylate, polyethylene glycol mono(meth)acrylate, polypropylene glycol mono(meth)acrylate, methoxyethylene glycol(meth)acrylate, ethoxyethyl (meth)acrylate, methoxypolyethylene glycol (meth)acrylate, methoxypolypropylene glycol (meth)acrylate; diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, N,N-dimethylaminopropyl (meth)acrylamide; and a one-terminal methacrylsiloxane monomer.

Examples of commercially available products of the monofunctional monomer include ARONIX M101, M102, M110, M111, M113, M117, M5700, TO-1317, M120, M150, and M156 (all manufactured by Toagosei Co., Ltd.), MEDOL10, MIBDOL10, CHDOL10, MMDOL30, MEDOL30, MIBDOL30, CHDOL30, LA, IBXA, 2-MTA, HPA, VISCOAT #150, #155, #158, #190, #192, #193, #220, #2000, #2100, and #2150 (all manufactured by Osaka Organic Chemical Industry Ltd.), light acrylate BO-A, EC-A, DMP-A, THF-A, HOP-A, HOA-MPE, HOA-MPL, HOA (N), PO-A, P-200A, NP-4EA, NP-BEA, IB-XA, and Epoxy Ester M-600A (all manufactured by Kyoeisha Chemical Co., Ltd.), KAYARAD TC110S, R-564, and R-128H (all manufactured by Nippon Kayaku Co., Ltd.), NK ester AMP-10G and AMP-20G (both manufactured by Shin-Nakamura Chemical Industry Co., Ltd.), FA-511A, FA-512A, FA-513A, and FA-BZA (all manufactured by Hitachi Chemical Co., Ltd.), PHE, CEA, PHE-2, PHE-4, BR-31, BR-31M, and BR-32 (all manufactured by DKS Co., Ltd.), VP (manufactured by BASF SE); ACMO, DMAA, and DMAPAA (all manufactured by KJ Chemicals Corporation), and X-22-2404 (manufactured by Shin-Etsu Chemical Co., Ltd.).

Examples of the photopolymerizable compound containing two polymerizable functional groups (bifunctional monomer) include trimethylolpropane di(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, and bis(hydroxymethyl) tricyclodecane di(meth)acrylate.

Examples of commercially available products of the bifunctional monomer include light acrylate 3EG-A, 4EG-A, 9EG-A, NP-A, DCP-A, BP-4EAL, and BP-4PA (all manufactured by Kyoeisha Chemical Co., Ltd.); and APG-100, APG-200, APG-400, and APG-700 (all manufactured by Shin-Nakamura Chemical Industry Co., Ltd.).

Examples of the photopolymerizable compound containing three or more polymerizable functional groups include a photopolymerizable siloxane compound, a photopolymerizable silsesquioxane compound, and a polyfunctional monomer containing three or more polymerizable functional groups.

Examples of the photopolymerizable siloxane compound include a compound containing an alkoxysilyl group and a polymerizable functional group in a molecule.

Examples of the commercially available product of the photopolymerizable siloxane compound include "KR-513", "X-40-9296", "KR-511", "X-12-1048", and "X-12-1050" (product names, all manufactured by Shin-Etsu Chemical Co., Ltd.).

Examples of the photopolymerizable silsesquioxane compound include a compound which has a main chain skeleton formed of a Si—O bond and is represented by the following chemical formula: $[(RSiO_{3/2})_n]$ (in the formula, R represents an organic group and n represents a natural number).

R represents a monovalent organic group, and examples of the monovalent organic group include a monovalent hydrocarbon group which may have a substituent. Examples of the hydrocarbon group include an aliphatic hydrocarbon group and an aromatic hydrocarbon group. Examples of the aliphatic hydrocarbon group include an alkyl group having 1 to 20 carbon atoms such as a methyl group, an ethyl group, an n-propyl group, an isopropyl group, an n-butyl group, a sec-butyl group, a tert-butyl group, a pentyl group, a hexyl group, a heptyl group, a 2-ethylhexyl group, an octyl group, a nonyl group, a decyl group, an undecyl group, or a dodecyl group. Among these, an alkyl group having 1 to 12 carbon atoms is preferable.

Examples of the aromatic hydrocarbon group include an aromatic hydrocarbon group having 6 to 20 carbon atoms such as a phenyl group, a naphthyl group, a benzyl group, a tolyl group, or a styryl group.

Examples of the substituent that a monovalent hydrocarbon group may have include a (meth)acryloyl group, a hydroxy group, a sulfanyl group, a carboxy group, an isocyanate group, an amino group, and a ureido group. Further, —CH$_2$— contained in the monovalent hydrocarbon group may be replaced with —O—, —S—, a carbonyl group, or the like.

Here, the photopolymerizable silsesquioxane compound contains three or more polymerizable functional groups. Examples of the polymerizable functional group here include a vinyl group, an allyl group, a methacryloyl group, and an acryloyl group.

The compound represented by the chemical formula: [(RSiO$_{3/2}$)$_n$] may be of a basket type, a ladder type, or a random type. The basket-type silsesquioxane compound may be of a complete basket type or an incomplete basket type in which a part of the basket is open.

Examples of the commercially available product of the photopolymerizable silsesquioxane compound include "MAC-SQ LP-35", "MAC-SQ TM-100", "MAC-SQ SI-20", and "MAC-SQ HDM" (all product names, manufactured by Toagosei Co., Ltd.).

Examples of the polyfunctional monomer containing three or more polymerizable functional groups include a trifunctional monomer such as ethoxylated (3) trimethylolpropane triacrylate, ethoxylated (3) trimethylolpropane trimethacrylate, ethoxylated (6) trimethylolpropane triacrylate, ethoxylated (9) trimethylolpropane triacrylate, ethoxylated (15) trimethylolpropane triacrylate, ethoxylated (20) trimethylolpropane triacrylate, pentaerythritol triacrylate, pentaerythritol trimethacrylate, propoxylated (3) glyceryl triacrylate, propoxylated (3) glyceryl triacrylate, propoxylated (5.5) glyceryl triacrylate, propoxylated (3) trimethylolpropane triacrylate, propoxylated (6) trimethylolpropane triacrylate, trimethylolpropane triacrylate, trimethylolpropane trimethacrylate, tris-(2-hydroxyethyl)-isocyanurate triacrylate, tris-(2-hydroxyethyl)-isocyanurate trimethacrylate, ε-caprolactone-modified tris-(2-acryloxyethyl) isocyanurate, EO-modified trimethylolpropane tri(meth)acrylate, PO-modified trimethylolpropane tri(meth)acrylate, or EO,PO-modified trimethylolpropane tri(meth)acrylate; a tetrafunctional monomer such as ditrimethylolpropane tetraacrylate, ethoxylated (4) pentaerythritol tetraacrylate, or pentaerythritol tetra(meth)acrylate; and a pentafunctional or higher functional monomer such as dipentaerythritol pentaacrylate or dipentaerythritol hexaacrylate.

Examples of the commercially available product of the polyfunctional monomer include "A-9300-1CL", "AD-TMP", "A-9550", and "A-DPH" (all manufactured by Shin-Nakamura Chemical Industry Co., Ltd.), "KAYARAD DPHA" (product name, manufactured by Nippon Kayaku Co., Ltd.), and "Light Acrylate TMP-A" (product name, manufactured by Kyoeisha Chemical Co., Ltd.).

Further, other examples of commercially available products of the component (B) include "NK Oligo EA-1010NT2" and "NK Ester A-BPML" (both product names, manufactured by Shin-Nakamura Chemical Industry Co., Ltd.).

The component (B) may be a photopolymerizable sulfur compound (hereinafter, also referred to as a component (BS)). The "photopolymerizable sulfur compound" is a photopolymerizable compound having a sulfur atom in a molecule. That is, the photopolymerizable sulfur compound is a monomer having a sulfur atom and a polymerizable functional group.

Examples of the component (BS) include a compound having a diaryl sulfide skeleton. Examples of the compound having a diaryl sulfide skeleton include a compound represented by General Formula (bs-1).

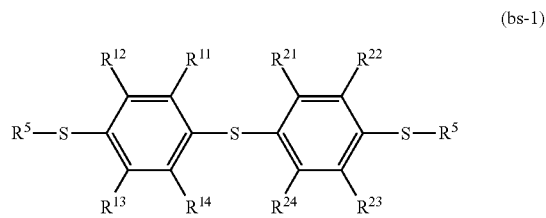

(bs-1)

[In the formula, $R^{11}$ to $R^{14}$ and $R^{21}$ to $R^{24}$ each independently represent a hydrogen atom, an alkyl group, or a halogen atom, and $R^5$ represents a polymerizable functional group.]

In Formula (bs-1), $R^{11}$ to $R^{14}$ and $R^{21}$ to $R^{24}$ each independently represent a hydrogen atom, an alkyl group, or a halogen atom.

The number of carbon atoms in the alkyl group is preferably in a range of 1 to 10, more preferably in a range of 1 to 6, still more preferably in a range of 1 to 4, and particularly preferably 1 to 3.

The alkyl group may be linear, branched, or cyclic. It is preferable that the alkyl group is linear or branched.

Examples of the linear alkyl group include a methyl group, an ethyl group, an n-propyl group, and an n-butyl group. Examples of the branched alkyl group include an isopropyl group, a sec-butyl group, and a tert-butyl group. Among these, as the alkyl group, a methyl group or an ethyl group is preferable, and a methyl group is more preferable.

Examples of the halogen atom as $R^{11}$ to $R^{14}$ and $R^{21}$ to $R^{24}$ include a fluorine atom, a chlorine atom, a bromine atom, and an iodine atom. Among these, a chlorine atom is particularly preferable as the halogen atom.

$R^{11}$ to $R^{14}$ and $R^{21}$ to $R^{24}$ represent preferably a hydrogen atom or an alkyl group, more preferably a hydrogen atom, a methyl group, or an ethyl group, and still more preferably a hydrogen atom.

In Formula (bs-1), $R^5$ represents a polymerizable functional group.

Examples of the polymerizable functional group are the same as those exemplified above. Among these, a vinyl group, an allyl group, an acryloyl group, or a methacryloyl group is preferable, and an acryloyl group or a methacryloyl group is more preferable as the polymerizable functional group.

$R^5$ represents preferably an acryloyl group or a methacryloyl group and more preferably an acryloyl group or a methacryloyl group.

Examples of the component (BS) include bis(4-methacryloylthiophenyl) sulfide and bis(4-acryloylthiophenyl) sulfide. Among these, bis(4-methacryloylthiophenyl) sulfide is preferable as the component (BS).

In the nanoimprint composition according to the present embodiment, the component (B) may be used alone or in combination of two or more kinds thereof.

The component (B) contains preferably a polyfunctional photopolymerizable compound and more preferably a polyfunctional monomer containing three or more polymerizable functional groups. In a case where the component (B) contains the polyfunctional photopolymerizable compound, curing is more likely to be promoted during formation of a cured film using the nanoimprint composition, and thus the stress resistance of the cured film is likely to be increased.

Alternatively, it is preferable to use a polyfunctional photopolymerizable compound and a monofunctional monomer in combination as the component (B). In a case where a polyfunctional photopolymerizable compound and a monofunctional monomer are used in combination, curing is more likely to be promoted during formation of a cured film using the nanoimprint composition, and thus the stress resistance of the cured film is likely to be increased.

The content of the component (B) in the nanoimprint composition of the present embodiment is 50 parts by mass or less, preferably in a range of 20 to 50 parts by mass, more preferably in a range of 20 to 40 parts by mass, still more preferably in a range of 20 to 35 parts by mass, and particularly preferably 20 to 30 parts by mass with respect to 100 parts by mass of the total content of the component (R) and the component (B).

In a case where the content of the component (B) is greater than or equal to the lower limit of the above-described preferable range, the hardness of the cured film formed by using the nanoimprint composition is increased, and the refractive index is likely to be increased. Further, in a case where the content of the component (B) is less than or equal to the upper limit of the above-described preferable range, the resistance of the cured film formed by using the nanoimprint composition to the stress is improved.

<Component (C)>

The component (C) is a photoradical polymerization initiator.

As the component (C), a compound that initiates polymerization of the component (R) and the component (B) upon exposure or promotes polymerization is used.

Examples of the component (C) include 1-hydroxycyclohexylphenyl ketone, 2-hydroxy-2-methyl-1-phenylpropan-1-one, 1-[4-(2-hydroxyethoxy)phenyl]-2-hydroxy-2-methyl-1-propan-1-one, 1-(4-isopropylphenyl)-2-hydroxy-2-methylpropan-1-one, 1-(4-dodecylphenyl)-2-hydroxy-2-methylpropan-1-one, 2,2-dimethoxy-1,2-diphenylethan-1-one, bis(4-dimethylaminophenyl)ketone, 2-methyl-1-(4-methylthiophenyl)-2-morpholinopropan-1-one, 2-benzyl-2-dimethylamino-1-(4-morpholinophenyl)-butanon-1, ethanone-1-[9-ethyl-6-(2-methylbenzoyl)-9H-carbazol-3-yl]-1-(o-acetyloxime), bis(2,4,6-trimethylbenzoyl)-phenylphosphine oxide, 4-benzoyl-4'-methyldimethylsulfide, 4-dimethylaminobenzoic acid, methyl 4-dimethylaminobenzoate, ethyl 4-dimethylaminobenzoate, butyl 4-dimethylaminobenzoate, 4-dimethylamino-2-ethylhexylbenzoic acid, 4-dimethylamino-2-isoamylbenzoic acid, benzyl-β-methoxyethyl acetal, benzyl dimethyl ketal, 1-phenyl-1,2-propanedion-2-(o-ethoxycarbonyl)oxime, methyl o-benzoyl benzoate, 2,4-diethylthioxanthone, 2-chlorothioxanthone, 2,4-dimethylthioxanthone, 1-chloro-4-propoxythioxanthone, thioxanthene, 2-chlorothioxanthene, 2,4-diethylthioxanthene, 2-methylthioxanthene, 2-isopropylthioxanthene, 2-ethylanthraquinone, octamethyl anthraquinone, 1,2-benzanthraquinone, 2,3-diphenylanthraquinone, azobisisobutyronitrile, benzoyl peroxide, cumeme peroxide, 2-mercaptobenzoimidal, 2-mercaptobenzoxazole, 2-mercaptobenzothiazole, a 2-(o-chlorophenyl)-4,5-di(m-methoxyphenyl)-imidazolyl dimer, benzophenone, 2-chlorobenzophenone, p,p'-bisdimethylaminobenzophenone, 4,4'-bisdiethylaminobenzophenone, 4,4'-dichlorobenzophenone, 3,3-dimethyl-4-methoxybenzophenone, benzoyl, benzoin, benzoin methyl ether, benzoin ethyl ether, benzoin isopropyl ether, benzoin-n-butyl ether, benzoin isobutyl ether, benzoin butyl ether, acetophenone, 2,2-diethoxyacetophenone, p-dimethylacetophenone, p-dimethylaminopropiophenone, dichloroacetophenone, trichloroacetophenone, p-tert-butylacetophenone, p-dimethylaminoacetophenone, p-tert-butyltrichloroacetophenone, p-tert-butyldichloroacetophenone, α,α-dichloro-4-phenoxyacetophenone, 2,2-dimethoxy-2-phenylacetophonone, thioxanthone, 2-methylthioxanthone, 2-isopropylthioxanthone, dibenzosuberone, pentyl-4-dimethylaminobenzoate, 9-phenylacridine, 1,7-bis-(9-acridinyl)heptane, 1,5-bis-(9-acridinyl)pentane, 1,3-bis-(9-acridinyl)propane, p-methoxytriazine, 2,4,6-tris (trichloromethyl)-s-triazine, 2-methyl-4,6-bis (trichloromethyl)-s-triazine, 2-[2-(5-methylfuran-2-yl) ethenyl]-4,6-bis(trichloromethyl)-s-triazine, 2-[2-(fran-2-yl) ethenyl]-4,6-bis (trichloromethyl)-s-triazine, 2-[2-(4-diethylamino-2-methylphenyl)ethenyl]-4,6-bis (trichloromethyl)-s-triazine, 2-[2-(3,4-dimethoxyphenyl) ethenyl]-4,6-bis(trichloromethyl)-s-triazine, 2-(4-methoxyphenyl)-4,6-bis(trichloromethyl)-s-triazine, 2-(4-ethoxystyryl)-4,6-bis (trichloromethyl)-s-triazine, 2-(4-n-butoxyphenyl)-4,6-bis(trichloromethyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(3-bromo-4-methoxy) styrylphenyl-s-triazine, 2,4-bis-trichloromethyl-6-(2-bromo-4-methoxy)styrylphenyl-s-triazine; ketone peroxides such as methyl ethyl ketone peroxide, methyl isobutyl ketone peroxide, and cyclohexanone peroxide; diacyl peroxides such as isobutylyl peroxide and bis(3,5,5-trimethylhexanoyl)peroxide; hydroperoxides such as p-menthanehydroperoxide and 1,1,3,3-tetramethylbutylhydroperoxide; dialkyl peroxides such as 2,5-dimethyl-2,5-bis(t-butylperoxy)hexane; peroxy ketals such as 1,1-bis(t-butylperoxy)-3, 3,5-trimethylcyclohexane; peroxy esters such as t-butylperoxyneodecanoate and 1,1,3,3-tetramethylperoxyneodecanoate; peroxydicarbonates such as di-n-propyl peroxydicarbonate and diisopropyl peroxydicarbonate; and azo compounds such as azobisisobutyronitrile, 2,2'-azobis(2,4-dimethylvaleronitrile), and 2,2'-azobisisobutyrate.

Among these, 1-hydroxycyclohexylphenyl ketone, 2-methyl-1-(4-methylthiophenyl)-2-morpholinopropan-1-one, 2-benzyl-2-dimethylamino-1-(4-morpholinophenyl)-butanon-1, bis(2,4,6-trimethylbenzoyl)-phenylphosphine oxide, and 2,2-dimethoxy-2-phenylacetophenone are preferable.

As the component (C), a commercially available product can be obtained and used.

Examples of the commercially available product of the component (C) include "IRGACURE 907" (product name, manufactured by BASF SE), "IRGACURE 369" (product name, manufactured by BASF SE), "IRGACURE 819" (product name, manufactured by BASF SE), and "Omnirad 184", "Omnirad 651", and "Omnirad 819" (all product name, manufactured by IGM Resins B. V.).

It is preferable that the component (C) has a small molecular weight. In a case where the molecular weight of the component (C) is small, the haze tends to further decrease. The molecular weight of the component (C) is, for example, preferably 500 or less, more preferably 400 or less, still more preferably 350 or less, and particularly preferably 300 or less. The lower limit of the molecular weight of the component (C) is not particularly limited and may be 100 or greater, 150 or greater, or 200 or greater. The molecular weight of the component (C) can be, for example, set to be in a range of 100 to 500 and is preferably in a range of 150 to 500, more preferably in a range of 150 to 400, still more preferably in a range of 150 to 350, and particularly preferably in a range of 150 to 300.

In the nanoimprint composition according to the present embodiment, the component (C) may be used alone or in combination of two or more kinds thereof.

The content of the component (C) in the nanoimprint composition of the present embodiment is preferably in a range of 1 to 20 parts by mass, more preferably in a range of 2 to 15 parts by mass, and still more preferably in a range of 5 to 15 parts by mass with respect to 100 parts by mass of the total amount of the component (R) and the component (B).

In a case where the content of the component (C) is greater than or equal to the lower limit of the above-described preferable range, the haze can be easily reduced and the high refractive index can be easily maintained. Further, in a case where the content of the component (C) is less than or equal to the upper limit of the above-described preferable range, the high refractive index of the cured film can be satisfactorily maintained.

<Component (S1)>

The component (S1) is a solvent component having compatibility with the component (R) and the component (B).

The "solvent component having compatibility with the component (R) and the component (B)" denotes a solvent component that is compatible with the component (R), compatible with the component (B), and further compatible with a mixture of the component (R) and the component (B). The component (S1) may be a solvent consisting of one solvent or a mixed solvent consisting of two or more kinds of solvents.

Further, the expression "compatible with the component (S1)" denotes that 5 g or greater of a substance is dissolved in 100 g of the component (S1) at 25° C.

In a case where the component (S1) is a solvent consisting of only one solvent (hereinafter, referred to as "component (S11)"), examples of the component include a lower alcohol compound such as methanol, ethanol, or propylene glycol, and a lower ketone compound such as acetone or methyl ethyl ketone.

In a case where the component (S1) is a mixed solvent consisting of two or more kinds of solvents, examples of the component include mixed solvents of those exemplified as the component (S11) described above and solvents (hereinafter, referred to as "component (S2)") other than those exemplified above.

Examples of the component (S2) includes a compound having an ester bond such as ethylene glycol monoacetate, diethylene glycol monoacetate, propylene glycol monoacetate, or dipropylene glycol monoacetate; a derivative of polyhydric alcohols, for example, the above-described compound having an ester bond or a compound having an ether bond such as monoalkyl ether such as monomethyl ether, monoethyl ether, monopropyl ether, or monobutyl ether or monophenyl ether [among these, propylene glycol monomethyl ether acetate (PGMEA), propylene glycol monomethyl ether (PGME) is preferable]; and ethyl acetate and butyl acetate.

In a case where the component (S1) is a mixed solvent consisting of the component (S11) and the component (S2), the content of the component (S11) is preferably 15% by mass or greater, more preferably 20% by mass or greater, and still more preferably 20% by mass or greater and 90% by mass or less with respect to 100% by mass of the total content of the component (S1).

In a case where the content of the component (S11) is greater than or equal to the lower limit of the above-described preferable range, reduction of the haze of the cured material in a visible light region is more likely to be achieved.

From the viewpoint of the compatibility with the component (R) and the component (B), the component (S1) contains preferably the component (S11), more preferably a lower alcohol compound, and still more preferably at least one solvent (S11a) selected from the group consisting of methanol, ethanol, and propylene glycol.

The content of the solvent (S11a) is preferably 20% by mass or greater and may be 100% by mass with respect to 100% by mass of the total content of the component (S1).

In a case where the content of the solvent (S11a) is greater than or equal to the lower limit of the above-described preferable range, reduction of the haze of the cured material in a visible light region is more likely to be achieved.

The amount of the component (S1) to be used is not particularly limited and may be appropriately set according to the thickness of the coating film of the nanoimprint composition. For example, the component (S1) can be used such that the amount thereof to be used is set to be in a range of 100 to 500 parts by mass with respect to 100 parts by mass of the total content of the component (R) and the component (B).

<Optional Components>

In addition to the component (R), the component (B), the component (C), and the component (S1), the nanoimprint composition of the embodiment may contain components (optional components) other than the above-described components.

Examples of such optional components include metal oxide nanoparticles (component (X), here, those corresponding to the component (R) are excluded), surfactants (component (E)), solvent components other than the component (S1), and miscible additives (such as a deterioration inhibitor, a release agent, a diluent, an antioxidant, a heat stabilizer, a flame retardant, a plasticizer, and other additives for improving the characteristics of the cured film).

<<Metal Oxide Nanoparticles: Component (X)>>

The component (X) is metal oxide nanoparticles.

The term "nanoparticles" denotes particles having a volume average primary particle diameter in nanometer order (less than 1000 nm). The metal oxide nanoparticles denote metal oxide particles having a volume average primary particle diameter in nanometer order.

The volume average primary particle diameter is a value measured by a dynamic light scattering method.

The volume average primary particle diameter of the component (X) is preferably 100 nm or less. The volume average primary particle diameter of the component (X) is preferably in a range of 0.1 to 100 nm, more preferably in a range of 1 to 60 nm, still more preferably in a range of 1 to 50 nm, even still more preferably in a range of 1 to 45 nm, and particularly preferably in a range of 1 to 40 nm. In addition, the volume average primary particle diameter of the component (X) is more preferably in a range of 5 to 30 nm, in a range of 5 to 25 nm, or in a range of 5 to 30 nm.

In a case where the volume average primary particle diameter of the component (X) is in the above-described preferable range, the metal oxide nanoparticles are satisfactorily dispersed in the nanoimprint composition. In addition, the refractive index is enhanced.

Commercially available metal oxide nanoparticles can be used as the component (X). Examples of the metal oxide include oxide particles such as titanium (Ti), zirconium (Zr), aluminum (Al), silicon (Si), zinc (Zn), and magnesium (Mg). Among these, from the viewpoint of the refractive index, titania ($TiO_2$) nanoparticles or zirconia ($ZrO_2$) nanoparticles are preferable as the component (X).

Commercially available metal oxide nanoparticles can be used as the component (X).

Examples of commercially available titania nanoparticles include TTO Series (TTO-51 (A), TTO-51 (C), and the like), TTO-S, and V Series (TTO-S-1, TTO-S-2, TTO-V-3, and the like) (all manufactured by Ishihara Sangyo Kaisha, Ltd.), Titania Sol LDB-014-35 (manufactured by Ishihara Sangyo Kaisha, Ltd.), MT Series (MT-01, MT-05, MT-100SA, MT-500SA, and the like) (all manufactured by Tayca Corporation), NS405, ELECOM V-9108 (manufactured by JGC C&C), and STR-100A-LP (manufactured by Sakai Chemical Industry Co., Ltd.).

Examples of commercially available zirconia nanoparticles include UEP (manufactured by Daiichi Kisenso Kagaku-Kogyo Co., Ltd.), UEP-100 (manufactured by Daiichi Kisenso Kagaku-Kogyo Co., Ltd.), PCS (manufactured by Nippon Denko Co., Ltd.), and JS-01, JS-03, and JS-04 (manufactured by Nippon Denko Co., Ltd.).

In the nanoimprint composition according to the present embodiment, the component (X) may be used alone or in combination of two or more kinds thereof.

<<Surfactant: Component (E)>>

The nanoimprint composition of the present embodiment may contain a surfactant (component (E)) in order to adjust the coatability and the like.

Examples of the component (E) include a silicone-based surfactant and a fluorine-based surfactant.

As the silicone-based surfactant, for example, BYK-077, BYK-085, BYK-300, BYK-301, BYK-302, BYK-306, BYK-307, BYK-310, BYK-320, BYK-322, BYK-323, BYK-325, BYK-330, BYK-331, BYK-333, BYK-335, BYK-341, BYK-344, BYK-345, BYK-346, BYK-348, BYK-354, BYK-355, BYK-356, BYK-358, BYK-361, BYK-370, BYK-371, BYK-375, BYK-380, and BYK-390 (all manufactured by BYK-Chemie GmbH) and the like can be used.

As the fluorine-based surfactant, F-114, F-177, F-410, F-411, F-450, F-493, F-494, F-443, F-444, F-445, F-446, F-470, F-471, F-472SF, F-474, F-475, F-477, F-478, F-479, F-480SF, F-482, F-483, F-484, F-486, F-487, F-172D, MCF-350SF, TF-1025SF, TF-1117SF, TF-1026SF, TF-1128, TF-1127, TF-1129, TF-1126, TF-1130, TF-1116SF, TF-1131, TF-1132, TF-1027SF, TF-1441, and TF-1442 (all manufactured by DIC Corporation), and PolyFox Series PF-636, PF-6320, PF-656, and PF-6520 (all manufactured by Omnova Solutions Inc.) and the like can be used.

In the nanoimprint composition according to the present embodiment, the component (E) may be used alone or in combination of two or more kinds thereof.

In a case where the nanoimprint composition of the present embodiment contains the component (E), the content of the component (E) is preferably in a range of 0.01 to 3 parts by mass, more preferably in a range of 0.02 to 1 part by mass, and still more preferably in a range of 0.03 to 0.5 part by mass with respect to 100 parts by mass of the total content of the component (R) and the component (B).

In a case where the content of the component (E) is in the above-described preferable range, the coatability of the nanoimprint composition is enhanced.

The cured film having a film thickness of 600 nm which is formed by using the nanoimprint composition of the present embodiment typically has a haze value of 0.1% or less as measured in conformity with ASTM D1003.

Since the nanoimprint composition of the present embodiment can form a cured film having such a low haze value, the composition can be suitably used for applications requiring high transparency such as 3D sensors and AR waveguides for AR (augmented reality) glasses.

The haze value of the cured film can be measured by a haze meter in conformity with ASTM D1003.

The cured film having a film thickness of 2 µm which is formed by using the nanoimprint composition of the present embodiment typically has a Young's modulus of 3.0 GPa or greater as measured in conformity with ISO14577.

Since the nanoimprint composition of the present embodiment can form a cured film having such a high Young's modulus, the resistance to the stress generated during mold release can be increased.

The Young's modulus of the cured film can be measured by a test method in conformity with ISO14577.

Further, the cured film formed by using the nanoimprint composition of the present embodiment has an increased refractive index, and the refractive index of the cured film at a wavelength of 530 nm is, for example, preferably 1.70 or greater.

The refractive index of the cured film can be measured by a spectroscopic ellipsometer.

The nanoimprint composition of the present embodiment described above contains the component (R) which is an unsaturated acid metal salt, the component (B) which is a photopolymerizable compound (here, compounds corresponding to the component (R) are excluded), the component (C) which is a photoradical polymerization initiator, and the component (S1) which is a solvent component having compatibility with the component (R) and the component (B). In addition, the content of the component (R) is 50 parts by mass or greater with respect to 100 parts by mass of the total content of the component (R) and the component (B). In the nanoimprint composition of the present embodiment, fine pattern transferability during pattern formation is satisfactory and improvement of stress resistance and reduction of haze of a cured material in a visible light region can be further achieved by using a specific amount of the component (R) and the component (B) in combination and by using a solvent component having compatibility with the these two components together with the components.

In the nanoimprint process, as the pattern becomes finer and more complicated, the stress generated on the nanoimprint material during mold release increases. In the nanoimprint composition of the present embodiment, the resistance to the stress is increased by employing a specific amount of the component (R). Therefore, the mold releasability is improved, and the fine pattern transferability during pattern formation is improved.

Further, in the nanoimprint composition of the present embodiment, the film density in a case where the component (R) and the component (B) are used in combination is further increased than that of a photocurable film formed of the component (B) alone due to the metal ion bond in the photocurable film. Therefore, the strength of the cured material is increased, and the resistance to the generated stress is improved. In addition, the refractive index of the cured material can also be increased.

Further, in the nanoimprint composition of the present embodiment, a solvent component having compatibility with the component (R) and the component (B) is employed as the solvent component. Therefore, a cured film in which formulation components are more uniformly mixed can be formed, and the haze can be reduced.

As described above, according to the nanoimprint composition of the present embodiment, pattern formation that satisfies all conditions of the resistance to the stress during the release, satisfactory fine pattern transferability, and reduction of haze in a visible light region can be realized.

By applying the nanoimprint composition of the present embodiment, the fine pattern transferability during pattern formation is enhanced, and a fine pattern in which the Young's modulus of the cured film having a film thickness of 2 μm is 3.0 GPa or greater and the haze value of the cured film having a film thickness of 600 nm of 0.1% or less can be easily formed.

(Pattern Forming Method)

A pattern forming method according to a second embodiment of the present invention includes a step of forming a photocurable film on a substrate using the nanoimprint composition according to the first embodiment (hereinafter, referred to as "step (i)"), a step of pressing a mold having an uneven pattern against the photocurable film to transfer the uneven pattern to the photocurable film (hereinafter, also referred to as "step (ii)"), a step of exposing the photocurable film to which the uneven pattern has been transferred while pressing the mold against the photocurable film to form a cured film (hereinafter, also referred to as "step (iii)"), and a step of peeling the mold off from the cured film (hereinafter, also referred to as "step (iv)").

FIGS. 1A to 1D are schematic step views for describing the embodiment of the pattern forming method.

[Step (i)]

In the step (i), a photocurable film is formed on a substrate using the nanoimprint composition according to the first embodiment described above.

As shown in FIG. 1A, a substrate 1 is coated with the nanoimprint composition according to the first embodiment described above to form a photocurable film 2. In FIG. 1A, a mold 3 is disposed above the photocurable film 2.

The substrate 1 can be selected depending on various applications, and examples thereof include a substrate for an electronic component and a substrate on which a predetermined wiring pattern is formed. Specific examples thereof include a substrate made of a metal such as silicon, silicon nitride, copper, chromium, iron, or aluminum; and a glass substrate. Examples of the material of the wiring pattern include copper, aluminum, nickel, and gold.

Further, the shape of the substrate 1 is not particularly limited and may be a plate shape or a roll shape. Further, as the substrate 1, a light-transmitting or non-light-transmitting substrate can be selected depending on the combination with the mold and the like.

Examples of the method of coating the substrate 1 with the nanoimprint composition include a spin coating method, a spray method, an ink jet method, a roll coating method, and a rotary coating method.

Since the photocurable film 2 functions as a mask of the substrate 1 in an etching step which may be subsequently performed, it is preferable that the photocurable film 2 has a uniform film thickness in a case of being applied to the substrate 1. From this viewpoint, the spin coating method is suitable in a case where the substrate 1 is coated with the nanoimprint composition.

The film thickness of the photocurable film 2 may be appropriately selected depending on the applications thereof, and may be, for example, approximately in a range of 0.05 to 30 μm.

[Step (ii)]

In the step (ii), the mold having an uneven pattern is pressed against the photocurable film to transfer the uneven pattern to the photocurable film.

Figure 1B:
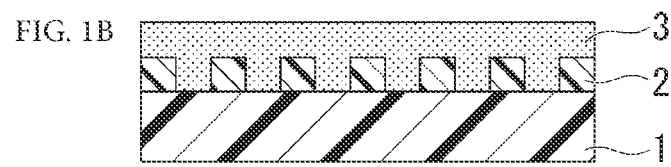
FIG. 1B is a schematic step view for describing an embodiment of a nanoimprint pattern forming method.

As shown in FIG. 1B, the mold 3 having a fine uneven pattern on the surface thereof is pressed against the substrate 1 on which the photocurable film 2 has been formed such that the mold 3 faces the photocurable film 2. In this manner, the photocurable film 2 is deformed according to the uneven structure of the mold 3.

The pressure on the photocurable film 2 during the pressing of the mold 3 is preferably 10 MPa or less, more preferably 5 MPa or less, and particularly preferably 1 MPa or less.

By pressing the mold 3 against the photocurable film 2, the nanoimprint composition positioned at projection portions of the mold 3 is easily pushed away to the side of recess portions of the mold 3, and thus the uneven structure of the mold 3 is transferred to the photocurable film 2.

The uneven pattern of the mold 3 can be formed according to the desired processing accuracy by, for example, photolithography or an electron beam drawing method.

A light-transmitting mold is preferable as the mold 3. The material of the light-transmitting mold is not particularly limited, but may be any material having predetermined strength and durability. Specific examples thereof include a phototransparent resin film such as glass, quartz, polymethyl methacrylate, or a polycarbonate resin, a transparent metal vapor deposition film, a flexible film such as polydimethylsiloxane, a photocured film, and a metal film.

[Step (iii)]

In the step (iii), the photocurable film to which the uneven pattern has been transferred is exposed while the mold is pressed against the photocurable film to form a resin cured film.

Figure 1C:
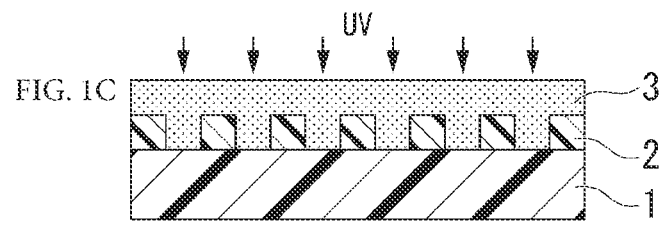
FIG. 1C is a schematic step view for describing an embodiment of a nanoimprint pattern forming method.

As shown in FIG. 1C, the photocurable film 2 to which the uneven pattern has been transferred is exposed in a state where the mold 3 is pressed against the photocurable film 2. Specifically, the photocurable film 2 is irradiated with electromagnetic waves such as ultraviolet rays (UV). The photocurable film 2 is cured by exposure in a state where the mold 3 is pressed, and thus a cured film (cured pattern) to which the uneven pattern of the mold 3 has been transferred is formed.

Further, the mold 3 in FIG. 1C has a transparency to electromagnetic waves.

The light used to cure the photocurable film 2 is not particularly limited, and examples thereof include light or radiation having a wavelength in a region such as high-energy ionizing radiation, near ultraviolet rays, far ultraviolet rays, visible rays, or infrared rays. As the radiation, for example, laser light used in fine processing of semiconductors, such as a microwave, EUV, LED, semiconductor laser light, KrF excimer laser light having a wavelength of 248 nm, or an ArF excimer laser having a wavelength of 193 nm can also be suitably used. As the light, monochrome light may be used, or light having a plurality of different wavelengths (mixed light) may be used.

[Step (iv)]

In the step (iv), the mold is peeled off from the cured film.

Figure 1D:
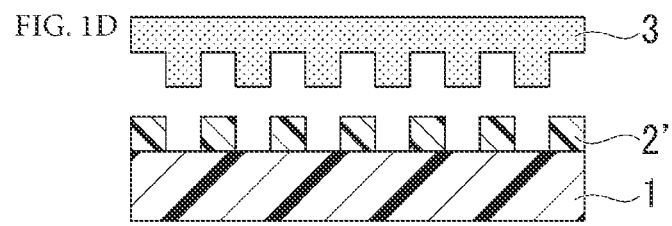
FIG. 1D is a schematic step view for describing an embodiment of a nanoimprint pattern forming method.

As shown in FIG. 1D, the mold 3 is peeled off from the cured film. In this manner, a pattern 2' (cured pattern) consisting of the cured film to which the uneven pattern has been transferred is patterned on the substrate 1.

In the pattern forming method of the present embodiment described above, since the nanoimprint composition of the first embodiment described above is used, a pattern in which fine pattern transferability during pattern formation is enhanced, the stress resistance is improved, and the haze in a visible light region is reduced can be formed.

In the present embodiment, a surface 31 of the mold 3 which is brought into contact with the photocurable film 2 may be coated with a release agent (FIG. 1A). In this manner, the releasability of the mold from the cured film can be improved.

Examples of the release agent here include a silicon-based release agent, a fluorine-based release agent, a polyethylene-based release agent, a polypropylene-based release agent, a paraffin-based release agent, a montan-based release agent, and a carnauba-based release agent. Among these, a fluorine-based release agent is preferable. For example, a commercially available coating type release agent such as OPTOOL DSX (manufactured by Daikin Industries, Ltd.) can be suitably used. The release agent may be used alone or in combination of two or more kinds thereof.

Further, in the present embodiment, an organic substance layer may be provided between the substrate 1 and the photocurable film 2. In this manner, a desired pattern can be easily and reliably formed on the substrate 1 by etching the substrate 1 using the photocurable film 2 and the organic substance layer as a mask.

The film thickness of the organic substance layer may be appropriately adjusted according to the depth at which the substrate 1 is processed (etched). Further, the film thickness thereof is preferably in a range of 0.02 to 2.0 μm. As the material of the organic substance layer, a material which has lower etching resistance to an oxygen-based gas than that of the nanoimprint composition and has a higher etching resistance to a halogen-based gas than that of the substrate 1 is preferable. The method of forming the organic substance layer is not particularly limited, and examples thereof include a sputtering method and a spin coating method.

The pattern forming method according to the second embodiment may further include other steps (optional steps) in addition to the steps (i) to (iv).

Examples of the optional steps include an etching step (step (v)) and a cured film (cured pattern) removal step (step (vi)) after the etching treatment.

[Step (v)]

In the step (v), for example, the substrate 1 is etched using the pattern 2' obtained in the above-described steps (i) to (iv) as a mask.

Figure 2A:
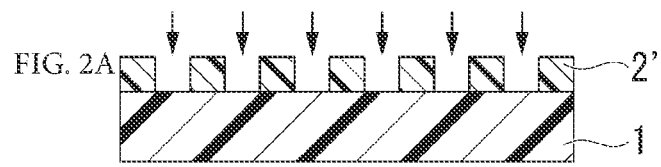
FIG. 2A is a schematic step view for describing an example of an optional step.

As shown in FIG. 2A, the substrate 1 on which the pattern 2' has been formed is irradiated with at least one of plasma and reactive ion gas (indicated by arrows) so that the portion of the substrate 1 exposed to the side of the pattern 2' is removed by etching to a predetermined depth.

The plasma or reactive ion gas used in the step (v) is not particularly limited as long as the gas is typically used in the dry etching field.

[Step (vi)]

In the step (vi), the cured film remaining after the etching treatment in the step (v) is removed.

Figure 2B:
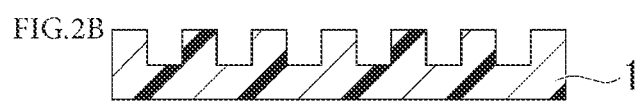
FIG. 2B is a schematic step view for describing an example of an optional step.

As shown in FIG. 2B, the step (vi) is a step of removing the cured film (pattern 2') remaining on the substrate 1 after the etching treatment performed on the substrate 1.

The method of removing the cured film (pattern 2') remaining on the substrate 1 is not particularly limited, and examples thereof include a treatment of washing the substrate 1 with a solution in which the cured film is dissolved.

EXAMPLES

Hereinafter, the present invention will be described in more detail with reference to examples, but the present invention is not limited to these examples.

Preparation of Nanoimprint Composition

Examples 1 to 23 and Comparative Examples 1 to 22

The components listed in Tables 1 to 4 were blended to prepare each nanoimprint composition of each example.

TABLE 1

|  | Unsaturated acid metal salt Component (R) | Photopolymerizable compound Component (B) | | Photoradical polymerization initiator Component (C) | Solvent component Component (S1) | Surfactant Component (E) |
| --- | --- | --- | --- | --- | --- | --- |
| Example 1 | (R)-1 [50] | (B)-1 [25] | (B)-2 [25] | (C)-1 [5] | (S1)-1 [233] | (E)-1 [0.25] |
| Example 2 | (R)-1 [70] | (B)-1 [30] | — | (C)-1 [5] | (S1)-1 [233] | (E)-1 [0.25] |
| Example 3 | (R)-1 [70] | (B)-1 [15] | (B)-2 [15] | (C)-1 [5] | (S1)-1 [233] | (E)-1 [0.25] |
| Example 4 | (R)-1 [50] | (B)-2 [25] | (B)-4 [25] | (C)-1 [5] | (S1)-1 [233] | (E)-1 [0.25] |
| Example 5 | (R)-1 [50] | (B)-2 [25] | (B)-5 [25] | (C)-1 [5] | (S1)-1 [233] | (E)-1 [0.25] |
| Example 6 | (R)-1 [50] | (B)-3 [25] | (B)-5 [25] | (C)-1 [5] | (S1)-1 [233] | (E)-1 [0.25] |
| Example 7 | (R)-1 [70] | (B)-2 [15] | (B)-4 [15] | (C)-1 [5] | (S1)-1 [233] | (E)-1 [0.25] |
| Example 8 | (R)-1 [70] | (B)-2 [15] | (B)-5 [15] | (C)-1 [5] | (S1)-1 [233] | (E)-1 [0.25] |
| Example 9 | (R)-1 [70] | (B)-3 [15] | (B)-5 [15] | (C)-1 [5] | (S1)-1 [233] | (E)-1 [0.25] |
| Example 10 | (R)-1 [70] | (B)-1 [15] | (B)-4 [15] | (C)-1 [5] | (S1)-1 [233] | (E)-1 [0.25] |

TABLE 1-continued

| | Unsaturated acid metal salt Component (R) | Photopolymerizable compound Component (B) | | Photoradical polymerization initiator Component (C) | Solvent component Component (S1) | Surfactant Component (E) |
|---|---|---|---|---|---|---|
| Example 11 | (R)-1 [70] | (B)-1 [15] | (B)-5 [15] | (C)-1 [5] | (S1)-1 [233] | (E)-1 [0.25] |
| Example 12 | (R)-1 [80] | (B)-2 [10] | (B)-5 [10] | (C)-1 [5] | (S1)-1 [233] | (E)-1 [0.25] |
| Example 13 | (R)-1 [80] | (B)-2 [10] | (B)-5 [10] | (C)-1 [5] | (S1)-2 [233] | (E)-1 [0.25] |
| Example 14 | (R)-1 [80] | (B)-2 [10] | (B)-5 [10] | (C)-1 [5] | (S1)-3 [233] | (E)-1 [0.25] |

TABLE 2

| | Unsaturated acid metal salt Component (R) | Photopolymerizable compound Component (B) | | Photoradical polymerization initiator Component (C) | Solvent component Component (S1) | Surfactant Component (E) |
|---|---|---|---|---|---|---|
| Example 15 | (R)-1 [80] | (B)-2 [10] | (B)-5 [10] | (C)-1 [5] | (S1)-4 [233] | (E)-1 [0.25] |
| Example 16 | (R)-1 [80] | (B)-2 [10] | (B)-5 [10] | (C)-1 [5] | (S1)-5 [233] | (E)-1 [0.25] |
| Example 17 | (R)-1 [80] | (B)-2 [10] | (B)-5 [10] | (C)-1 [5] | (S1)-6 [233] | (E)-1 [0.25] |
| Example 18 | (R)-1 [80] | (B)-2 [10] | (B)-5 [10] | (C)-1 [5] | (S1)-7 [233] | (E)-1 [0.25] |
| Example 19 | (R)-1 [80] | (B)-2 [10] | (B)-5 [10] | (C)-1 [5] | (S1)-8 [233] | (E)-1 [0.25] |
| Example 20 | (R)-1 [80] | (B)-2 [10] | (B)-5 [10] | (C)-1 [5] | (S1)-9 [233] | (E)-1 [0.25] |
| Example 21 | (R)-1 [80] | (B)-1 [10] | (B)-2 [10] | (C)-1 [5] | (S1)-4 [233] | (E)-1 [0.25] |
| Example 22 | (R)-1 [80] | (B)-2 [10] | (B)-3 [10] | (C)-1 [5] | (S1)-4 [233] | (E)-1 [0.25] |
| Example 23 | (R)-1 [80] | (B)-3 [10] | (B)-5 [10] | (C)-1 [5] | (S1)-4 [233] | (E)-1 [0.25] |

TABLE 3

| | Unsaturated acid metal salt Component (R) | Photopolymerizable compound Component (B) | | Photoradical polymerization initiator Component (C) | Solvent component Component (S1) | Surfactant Component (E) |
|---|---|---|---|---|---|---|
| Comparative Example 1 | (R)-1 [80] | (B)-2 [10] | (B)-5 [10] | (C)-1 [5] | (S2)-1 [233] | (E)-1 [0.25] |
| Comparative Example 2 | (R)-1 [80] | (B)-2 [10] | (B)-5 [10] | (C)-1 [5] | (S2)-2 [233] | (E)-1 [0.25] |
| Comparative Example 3 | (R)-1 [50] | (B)-2 [25] | (B)-5 [25] | (C)-1 [5] | (S2)-1 [233] | (E)-1 [0.25] |
| Comparative Example 4 | (R)-1 [50] | (B)-2 [25] | (B)-5 [25] | (C)-1 [5] | (S2)-2 [233] | (E)-1 [0.25] |
| Comparative Example 5 | (R)-1 [50] | (B)-2 [25] | (B)-5 [25] | (C)-1 [5] | (S2)-3 [233] | (E)-1 [0.25] |
| Comparative Example 6 | (R)-1 [50] | (B)-2 [25] | (B)-5 [25] | (C)-1 [5] | (S2)-4 [233] | (E)-1 [0.25] |
| Comparative Example 7 | (R)-1 [50] | (B)-2 [25] | (B)-5 [25] | (C)-1 [5] | (S2)-5 [233] | (E)-1 [0.25] |
| Comparative Example 8 | (R)-1 [50] | (B)-2 [25] | (B)-5 [25] | (C)-1 [5] | (S2)-6 [233] | (E)-1 [0.25] |

TABLE 4

| | Unsaturated acid metal salt Component (R) | Photopolymerizable compound Component (B) | | Photoradical polymerization initiator Component (C) | Solvent component | Surfactant Component (E) |
|---|---|---|---|---|---|---|
| Comparative Example 9 | (R)-1 [40] | (B)-5 [60] | — | (C)-1 [5] | (S1)-1 [233] | (E)-1 [0.25] |
| Comparative Example 10 | (R)-1 [40] | (B)-1 [60] | — | (C)-1 [5] | (S1)-1 [233] | (E)-1 [0.25] |
| Comparative Example 11 | (R)-1 [40] | (B)-1 [60] | — | (C)-1 [5] | (S1)-1 [233] | (E)-1 [0.25] |
| Comparative Example 12 | (R)-1 [40] | (B)-1 [30] | (B)-5 [30] | (C)-1 [5] | (S1)-2 [233] | (E)-1 [0.25] |
| Comparative Example 13 | (R)-1 [40] | (B)-1 [30] | (B)-5 [30] | (C)-1 [5] | (S1)-3 [233] | (E)-1 [0.25] |
| Comparative Example 14 | (R)-1 [40] | (B)-2 [30] | (B)-5 [30] | (C)-1 [5] | (S1)-2 [233] | (E)-1 [0.25] |
| Comparative Example 15 | (R)-1 [40] | (B)-2 [30] | (B)-5 [30] | (C)-1 [5] | (S1)-3 [233] | (E)-1 [0.25] |
| Comparative Example 16 | (R)-1 [40] | (B)-3 [30] | (B)-5 [30] | (C)-1 [5] | (S1)-1 [233] | (E)-1 [0.25] |
| Comparative Example 17 | (R)-1 [15] | (B)-4 [85] | — | (C)-1 [5] | (S1)-4 [233] | (E)-1 [0.25] |
| Comparative Example 18 | (R)-1 [15] | (B)-5 [85] | — | (C)-1 [5] | (S1)-4 [233] | (E)-1 [0.25] |
| Comparative Example 19 | (R)-1 [15] | (B)-4 [85] | — | (C)-1 [5] | (S2)-1 [233] | (E)-1 [0.25] |
| Comparative Example 20 | (R)-1 [15] | (B)-4 [85] | — | (C)-1 [5] | (S2)-2 [233] | (E)-1 [0.25] |
| Comparative Example 21 | (R)-1 [15] | (B)-5 [85] | — | (C)-1 [5] | (S2)-2 [233] | (E)-1 [0.25] |
| Comparative Example 22 | — | (B)-1 [100] | — | (C)-1 [5] | (S2)-2 [233] | (E)-1 [0.25] |

In Tables 1 to 4, each abbreviation has the following meaning. The numerical values in the parentheses are blending amounts (parts by mass).

Component (R) (unsaturated acid metal salt)

(R)-1: Zinc acrylate (CAS No. 14643-87-9), "ZN-DA100" (product name), manufactured by Nippon Shokubai Co., Ltd.

Component (B) (photopolymerizable compound)

(B)-1: polyfunctional acrylate, "KAYARAD DPHA" (product name), manufactured by Nippon Kayaku Co., Ltd.

(B)-2: trimethylolpropane triacrylate (CAS number 15625-89-5), "LIGHT ACRYLATE TMP-A" (product name), manufactured by Kyoeisha Chemical Co., Ltd.

(B)-3: dipropylene glycol diacrylate (CAS number 57472-68-1), "APG-100" (product name), manufactured by Shin-Nakamura Chemical Industry Co., Ltd.

(B)-4: tetrahydrofurfuryl acrylate (CAS No. 2399-48-6), "LIGHT ACRYLATE THF-A" (product name), manufactured by Kyoeisha Chemical Co., Ltd.

(B)-5: acryloylmorpholine (CAS No. 5117-12-4), "ACMO" (product name), manufactured by KJ Chemicals Corporation Component (C) (photoradical polymerization initiator)

(C)-1: 2,2-dimethoxy-2-phenylacetophenone, "Omnirad 651" (product name), manufactured by IGM Resins B. V., molecular weight: 256.3

Component (S1) (solvent component having compatibility with component (R) and component (B))

(S1)-1: methanol
(S1)-2: ethanol
(S1)-3: propylene glycol
(S1)-4: mixed solvent of methanol/PGME=46.6/186.4 (mass ratio) (S1)-5: mixed solvent of methanol/PGMEA=46.6/186.4 (mass ratio) (S1)-6: mixed solvent of ethanol/PGME=46.6/186.4 (mass ratio) (S1)-7: mixed solvent of ethanol/PGMEA=46.6/186.4 (mass ratio) (S1)-8: mixed solvent of propylene glycol/PGME=46.6/186.4 (mass ratio)

(S1)-9: mixed solvent of propylene glycol/PGMEA=46.6/186.4 (mass ratio)

Component (S2) (solvent component other than component (S1))

(S2)-1: propylene glycol monomethyl ether (PGME)
(S2)-2: propylene glycol monomethyl ether acetate (PGMEA)
(S2)-3: mixed solvent of methanol/PGME=30/203 (mass ratio)
(S2)-4: mixed solvent of methanol/PGMEA=30/203 (mass ratio)
(S2)-5: mixed solvent of ethanol/PGME=30/203 (mass ratio)
(S2)-6: mixed solvent of propylene glycol/PGME=30/203 (mass ratio)

Component (E) (surfactant)
(E)-1: "PolyFox PF656" (product name), manufactured by Omnova Solutions Inc., fluorine-based surfactant <Evaluation (1)>

The compatibility of the solvent component with the component (R) and the component (B) blended to the nanoimprint composition of each example was evaluated by the following method.

[Compatibility]

The compatibility was evaluated by confirming whether 5 g or greater of a mixture of the component (R) and the component (B) mixed at a blending ratio listed in Tables 1 to 4, 5 g or greater of the component (R), and 5 g or greater of the component (B) were dissolved in 100 g of the solvent component (the component (S1) or the component (S2)) at 25° C.

The evaluation of the compatibility was performed by visually comparing a change in transparency and the presence or absence of a precipitate during preparation and after standing for 24 hours.

The compatibility between the component (R) and the component (B) blended with the nanoimprint compositions of Examples 1 to 23 and the component (S1) which is a solvent component was satisfactory based on the evaluation results of compatibility.

The compatibility between the component (R) and the component (B) blended with the nanoimprint compositions of Comparative Examples 1 to 8 and 19 to 21 and the component (S2) which is a solvent component was poor.

The compatibility between the component (R) and the component (B) blended with the nanoimprint compositions of Comparative Examples 9 to 18 and the component (S1) which is a solvent component was satisfactory.

The compatibility between the component (B) blended with the nanoimprint compositions of Comparative Example 22 and the component (S2) which is a solvent component was satisfactory.

<Evaluation (2)>

The imprint transferability, and the Young's modulus and the haze of the cured film were evaluated for the nanoimprint composition of each example by each method described below. The results are listed in Tables 5 and 6.

[Formation of Cured Film]

A silicon substrate was spin-coated with the nanoimprint composition such that the film thickness reached 600 nm.

Next, the composition was prebaked at 100° C. for 1 minute, and a transfer test was performed using an imprint device ST-200 (manufactured by Toshiba Machine Co., Ltd.) at a transfer pressure of 0.5 MPa and an exposure amount of 1 $J/cm^2$ (in a vacuum atmosphere of 200 Pa) for a transfer time of 30 seconds.

A standard film mold LSP70-140 (70 nm Line & Space) (manufactured by Soken Chemical Co., Ltd.) was used as the mold.

In the transfer test, a case where the curability was insufficient as a result of exposing the photocurable film was determined as "curing failure", and the following evaluation was not carried out.

[Imprint Transferability]

The transferability of the fine pattern and the filling property were evaluated by performing the transfer test according to the following criteria.

Good: The filling rate of the transfer pattern was 95% or greater.

Poor: The filling rate of the transfer pattern was less than 95%.

The filling rate of the transfer pattern was acquired from the ratio of the patterns that was able to be transferred without chipping from the shape of the mold by observing the cross-sectional SEM image after formation of the 70 nm Line & Space pattern.

[Young's Modulus]

An Eagle XG glass substrate was spin-coated with the nanoimprint composition such that the film thickness of the cured film was adjusted to 2 μm. Next, the composition was prebaked at 100° C. for 1 minute and subjected to a photocuring treatment using an imprint device ST-200 (manufactured by Toshiba Machine Co., Ltd.) at an exposure amount of 1 $J/cm^2$ (in a vacuum atmosphere of 200 Pa), thereby obtaining a cured film.

The Young's modulus (GPa) of the obtained cured film having a film thickness of 2 μm was measured under the conditions of a pressure of 1 mN and a measurement time of 20 seconds using a FISCHERSCOPE HM2000 (manufactured by Fischer Instruments K.K.) in conformity with ISO14577.

[Haze]

An Eagle XG glass substrate was spin-coated with the nanoimprint composition such that the film thickness of the cured film was adjusted to 600 nm. Next, the composition was prebaked at 100° C. for 1 minute and subjected to a photocuring treatment using an imprint device ST-200 (manufactured by Toshiba Machine Co., Ltd.) at an exposure amount of 1 $J/cm^2$ (in a vacuum atmosphere of 200 Pa), thereby obtaining a cured film.

The haze (%) of the obtained cured film having a film thickness of 600 nm was measured with a light source illumination C (380 to 780 nm) using a haze meter COH7700 (manufactured by Nippon Denshoku Industries Co., Ltd.) in conformity with ASTM D1003.

TABLE 5

| | Imprint transferability | Young's modulus (GPa) | Haze (%) |
|---|---|---|---|
| Example 1 | Good | 3.2 | 0.1 |
| Example 2 | Good | 3.8 | 0.1 |
| Example 3 | Good | 3.5 | 0.1 |
| Example 4 | Good | 3.1 | 0.1 |
| Example 5 | Good | 3.2 | 0.1 |
| Example 6 | Good | 3.1 | 0.1 |
| Example 7 | Good | 3.8 | 0.1 |
| Example 8 | Good | 3.9 | 0.1 |
| Example 9 | Good | 3.6 | 0.1 |
| Example 10 | Good | 4.1 | 0.1 |
| Example 11 | Good | 4.2 | 0 |
| Example 12 | Good | 4.4 | 0 |
| Example 13 | Good | 4.4 | 0.1 |
| Example 14 | Good | 4.4 | 0.1 |
| Example 15 | Good | 4.4 | 0 |
| Example 16 | Good | 4.5 | 0 |
| Example 17 | Good | 4.4 | 0.1 |
| Example 18 | Good | 4.4 | 0.1 |
| Example 19 | Good | 4.4 | 0 |
| Example 20 | Good | 4.5 | 0 |
| Example 21 | Good | 5.1 | 0 |
| Example 22 | Good | 4.5 | 0 |
| Example 23 | Good | 3.6 | 0.1 |

TABLE 6

| | Imprint transferability | Young's modulus (GPa) | Haze (%) |
|---|---|---|---|
| Comparative Example 1 | — | — | — |
| Comparative Example 2 | — | — | — |
| Comparative Example 3 | — | — | — |
| Comparative Example 4 | — | — | — |
| Comparative Example 5 | Good | 3.1 | 0.4 |
| Comparative Example 6 | Good | 3.1 | 0.8 |
| Comparative Example 7 | Good | 3.1 | 0.5 |
| Comparative Example 8 | Good | 3.1 | 0.4 |
| Comparative Example 9 | Good | 1.7 | 0.1 |
| Comparative Example 10 | Good | 2.8 | 0.1 |
| Comparative Example 11 | Good | 2.6 | 0.1 |
| Comparative Example 12 | Good | 2.7 | 0.1 |
| Comparative Example 13 | Good | 2.7 | 0.1 |

TABLE 6-continued

| | Imprint transferability | Young's modulus (GPa) | Haze (%) |
|---|---|---|---|
| Comparative Example 14 | Good | 2.4 | 0.1 |
| Comparative Example 15 | Good | 2.5 | 0.1 |
| Comparative Example 16 | Good | 2.6 | 0.1 |
| Comparative Example 17 | | Curing failure | |
| Comparative Example 18 | | Curing failure | |
| Comparative Example 19 | | Curing failure | |
| Comparative Example 20 | — | — | — |
| Comparative Example 21 | — | — | — |
| Comparative Example 22 | Good | 2.0 | 0 |

As shown in the results of Tables 5 to 6, the nanoimprint compositions of Examples 1 to 23 to which the present invention was applied had satisfactory imprint transferability, and the formed cured films had a Young's modulus of 3.0 GPa or greater and thus had sufficient stress resistance. In addition, the haze value was reduced to 0.1% or less.

On the contrary, in the nanoimprint compositions of the comparative examples, the nanoimprint compositions of Comparative Examples 1 to 4, 20, and 21 were turbid without being dissolved during blending and preparing each component.

In the nanoimprint compositions of Comparative Examples 5 to 8, the imprint transferability was satisfactory and the Young's modulus was 3.0 GPa or greater, but the haze was deteriorated.

In the nanoimprint compositions of Comparative Examples 9 to 16 and 22, the imprint transferability was satisfactory and the haze value was reduced to 0.1% or less, but the Young's modulus was less than 3.0 GPa and thus the stress resistance was poor.

The nanoimprint compositions of Comparative Examples 17 to 19 showed curing failure in the formation of the cured film.

As shown in these results, it was confirmed that the nanoimprint compositions of the examples had satisfactory fine pattern transferability during pattern formation and improvement of the stress resistance and reduction of the haze of the cured material in a visible light region were able to be further achieved.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

EXPLANATION OF REFERENCES

1: Substrate
2: Photocurable film
3: Mold

What is claimed is:

1. A pattern forming method comprising:
   forming a photocurable film on a substrate using a nanoimprint composition;
   pressing a mold having an uneven pattern against the photocurable film to transfer the uneven pattern to the photocurable film;
   exposing the photocurable film to which the uneven pattern has been transferred while pressing the mold against the photocurable film to form a cured film; and
   peeling the mold off the cured film,
   the nanoimprint composition comprising:
   a component (R) which is an unsaturated acid metal salt selected from the group consisting of zinc (meth) acrylate, calcium (meth)acrylate, magnesium (meth) acrylate, and aluminum (meth)acrylate;
   a component (B) which is a photopolymerizable compound, provided that a compound corresponding to the component (R) is excluded from the component (B);
   a component (C) which is a photoradical polymerization initiator; and
   a component (S1) which is a solvent component having compatibility with the component (R) and the component (B),
   wherein a content of the component (R) is 50 parts by mass or greater with respect to 100 parts by mass of a total content of the component (R) and the component (B),
   a content of the component (B) is 20 to 50 parts by mass with respect to 100 parts by mass of the total content of the component (R) and the component (B),
   the component (S1) contains at least one solvent (S11a) selected from the group consisting of methanol, ethanol, and propylene glycol, and
   a content of the solvent (S11a) is 20% by mass or greater with respect to 100% by mass of a total content of the component (S1).

2. The method according to claim 1, wherein the component (B) contains a polyfunctional photopolymerizable compound.

3. The method according to claim 1, wherein a cured film having a film thickness of 600 nm which is formed by using the nanoimprint composition has a haze value of 0.1% or less, measured in conformity with ASTM D1003.

4. The method according to claim 2, wherein a cured film having a film thickness of 2 μm which is formed by using the nanoimprint composition has a Young's modulus of 3.0 GPa or greater, measured in conformity with ISO14577.

5. A pattern forming method comprising:
   forming a photocurable film on a substrate using a nanoimprint composition;
   pressing a mold having an uneven pattern against the photocurable film to transfer the uneven pattern to the photocurable film;
   exposing the photocurable film to which the uneven pattern has been transferred while pressing the mold against the photocurable film to form a cured film; and
   peeling the mold off the cured film, wherein the nanoimprint composition comprises:
   a component (R) which is an unsaturated acid metal salt selected from the group consisting of zinc (meth) acrylate, calcium (meth)acrylate, magnesium (meth) acrylate, and aluminum (meth)acrylate;
   a component (B) which is a photopolymerizable compound, provided that a compound corresponding to the component (R) is excluded from the component (B);

a component (C) which is a photoradical polymerization initiator; and a component (S1) which is a solvent component having compatibility with the component (R) and the component (B), wherein a content of the component (R) is 50 parts by mass or greater with respect to 100 parts by mass of a total content of the component (R) and the component (B), the component (S1) contains at least one solvent (S11a) selected from the group consisting of methanol, ethanol, and propylene glycol, a content of the solvent (S11a) is 20% by mass or greater with respect to 100% by mass of a total content of the component (S1), and the nanoimprint composition does not comprise 1-hydroxycyclohexylphenyl ketone.

6. The method according to claim 5, wherein the component (B) contains a polyfunctional photopolymerizable compound.

7. The method according to claim 5, wherein a cured film having a film thickness of 600 nm which is formed by using the nanoimprint composition has a haze value of 0.1% or less, measured in conformity with ASTM D1003.

8. The method according to claim 6, wherein a cured film having a film thickness of 2 μm which is formed by using the nanoimprint composition has a Young's modulus of 3.0 GPa or greater, measured in conformity with ISO14577.

9. A pattern forming method comprising:

forming a photocurable film on a substrate using a nanoimprint composition;

pressing a mold having an uneven pattern against the photocurable film to transfer the uneven pattern to the photocurable film;

exposing the photocurable film to which the uneven pattern has been transferred while pressing the mold against the photocurable film to form a cured film; and peeling the mold off the cured film, wherein the nanoimprint composition comprises:

a component (R) which is an unsaturated acid metal salt selected from the group consisting of zinc (meth)acrylate, calcium (meth)acrylate, magnesium (meth)acrylate, and aluminum (meth)acrylate;

a component (B) which is a photopolymerizable compound, provided that a compound corresponding to the component (R) is excluded from the component (B);

a component (C) which is a photoradical polymerization initiator; and a component (S1) which is a solvent component having compatibility with the component (R) and the component (B), wherein a content of the component (R) is 50 parts by mass or greater with respect to 100 parts by mass of a total content of the component (R) and the component (B), the component (S1) contains at least one solvent (S11a) selected from the group consisting of methanol, ethanol, and propylene glycol, a content of the solvent (S11a) is 20% by mass or greater with respect to 100% by mass of a total content of the component (S1), and the nanoimprint composition does not comprise dipentaerythritol pentaacrylate.

10. The method according to claim 9, wherein the component (B) contains a polyfunctional photopolymerizable compound.

11. The method according to claim 9, wherein a cured film having a film thickness of 600 nm which is formed by using the nanoimprint composition has a haze value of 0.1% or less, measured in conformity with ASTM D1003.

12. The method according to claim 10, wherein a cured film having a film thickness of 2 μm which is formed by using the nanoimprint composition has a Young's modulus of 3.0 GPa or greater, measured in conformity with ISO14577.

* * * * *